(12) United States Patent
Wang et al.

(10) Patent No.: US 8,853,099 B2
(45) Date of Patent: Oct. 7, 2014

(54) NONVOLATILE RESISTIVE MEMORY ELEMENT WITH A METAL NITRIDE CONTAINING SWITCHING LAYER

(75) Inventors: Yun Wang, San Jose, CA (US); Tony P. Chiang, Campbell, CA (US); Imran Hashim, Saratoga, CA (US); Tim Minvielle, San Jose, CA (US); Takeshi Yamaguchi, Kanagawa (JP)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 70 days.

(21) Appl. No.: 13/328,423

(22) Filed: Dec. 16, 2011

(65) Prior Publication Data

US 2013/0153845 A1    Jun. 20, 2013

(51) Int. Cl.
*H01L 21/31* (2006.01)

(52) U.S. Cl.
USPC ............................ 438/775; 438/761; 438/770

(58) Field of Classification Search
USPC .......................................... 438/761, 770, 775
See application file for complete search history.

(56) References Cited

U.S. PATENT DOCUMENTS

| 7,808,810 | B2 | 10/2010 | Herner |
| 7,816,205 | B2 | 10/2010 | Balseanu |
| 7,816,659 | B2 | 10/2010 | Herner |
| 7,829,875 | B2 | 11/2010 | Scheuerlein |
| 2008/0014448 | A1 | 1/2008 | Jang et al. |
| 2010/0167463 | A1 | 7/2010 | Sung |
| 2010/0230655 | A1* | 9/2010 | Noshiro ............................ 257/5 |
| 2011/0095259 | A1 | 4/2011 | Lee |
| 2012/0086104 | A1* | 4/2012 | Marsh ............................ 257/532 |
| 2012/0243293 | A1* | 9/2012 | Takashima et al. ........... 365/148 |

OTHER PUBLICATIONS

Becker, J., et al.; Atomic Layer Deposition of Insulating Hafnium and Zirconium Nitrides; Jan. 1, 2004; Harvard, College (US) ; Cherm. Mater pp. 34973501.

Xu, Y., et al.; Atomic Layer Deposition of Hafnium Nitrides Using Ammonia and Alkylamide Precurcors; Jan. 1, 2005; Academia—Stanford University; Chemical Physics Letters pp. 272275.

Kim, W., et al.; FormingFree NitrogenDoped AlOx RRAM with sub25nA Reset Current; Jan. 1, 2011; Academia—Stanford University; 2 pages.

Sivasubramani, P., et al.; Effect of Composition on the Thermal Stability of Sputter Deposited Hafnium Aluminate and Nitrided Hafnium Aluminate Dielectrics on Si 100; Jan. 1, 2007; American Institute of Physics; Journal of Applied Physics pp. 11410811141086.

* cited by examiner

*Primary Examiner* — Jae Lee (57) ABSTRACT

A nonvolatile resistive memory element has a novel variable resistance layer that includes a metal nitride, a metal oxide-nitride, a two-metal oxide-nitride, or a multilayer stack thereof. One method of forming the novel variable resistance layer comprises an interlayer deposition procedure, in which metal oxide layers are interspersed with metal nitride layers and then converted into a substantially homogeneous layer by an anneal process. Another method of forming the novel variable resistance layer comprises an intralayer deposition procedure, in which various ALD processes are sequentially interleaved to form a metal oxide-nitride layer. Alternatively, a metal oxide is deposited, nitridized, and annealed to form the variable resistance layer or a metal nitride is deposited, oxidized, and annealed to form the variable resistance layer.

6 Claims, 11 Drawing Sheets

NONVOLATILE RESISTIVE MEMORY ELEMENT WITH A METAL NITRIDE CONTAINING SWITCHING LAYER

BACKGROUND

1. Field of the Invention

This invention relates to nonvolatile resistive memory elements, and more particularly, to a nonvolatile resistive memory element with a metal-nitride-containing switching layer and methods for forming the same.

2. Description of the Related Art

Nonvolatile memory elements are used in devices requiring persistent data storage, such as digital cameras and digital music players, as well as in computer systems. Electrically-erasable programmable read only memory (EPROM) and NAND flash are nonvolatile memory technologies currently in use. However, as device dimensions shrink, scaling issues pose challenges for traditional nonvolatile memory technology. This has led to the investigation of alternative nonvolatile memory technologies, including resistive switching nonvolatile memory.

Resistive switching nonvolatile memory is formed using memory elements that are bistable, i.e., having two stable states with different resistances. A bistable memory element can be placed in a high resistance state or a low resistance state by application of suitable voltages or currents. Voltage pulses are typically used to switch the bistable memory element from one resistance state to the other. Subsequently, nondestructive read operations can be performed on the memory element to ascertain the value of a data bit that is stored therein.

As resistive switching memory device sizes shrink, it is important to reduce the required currents and voltages that are necessary to reliably set, reset and/or determine the desired "on" and "off" states of the device, thereby minimizing power consumption of the device, resistive heating of the device, and cross-talk between adjacent devices.

In light of the above, there is a need in the art for nonvolatile resistive switching memory devices having reduced current and voltage requirements.

SUMMARY

Embodiments of the invention set forth a ReRAM nonvolatile memory element having a novel variable resistance layer and methods of forming the same. The novel variable resistance layer can include a metal nitride, a metal oxide-nitride, a two-metal oxide-nitride, or a multilayer stack thereof.

According to one embodiment of the present invention, a nonvolatile memory element comprises a first electrode layer formed on a substrate, a second electrode layer, and a variable resistance layer disposed between the first electrode layer and the second electrode layer, wherein the variable resistance layer comprises a metal nitride layer, a metal oxide-nitride layer, a two-metal oxide-nitride layer, or a combination thereof.

According to another embodiment of the present invention, a method of forming a variable resistance layer in a nonvolatile memory element includes the steps of forming a first electrode layer on a substrate, depositing a first metal layer on the first electrode layer using an atomic layer deposition (ALD) process, oxidizing the first metal layer by heating the first metal layer while exposing the first metal layer to an oxygen-containing gas, depositing a second metal layer on the oxidized first metal layer using an ALD process, diffusing nitrogen into the second metal layer by exposing the second metal layer to a nitrogen-containing gas, and forming a second electrode layer, so that the first metal layer and the second metal layer are disposed between the first electrode layer and the second electrode layer.

According to another embodiment of the present invention, a method of forming a variable resistance layer in a nonvolatile memory element includes the steps of forming a first electrode layer on a substrate, depositing a first metal layer on the first electrode layer using an ALD process, oxidizing the first metal layer by heating the first metal layer while exposing the first metal layer to an oxygen-containing gas, diffusing nitrogen into the first metal layer by exposing the first metal layer to a reactive nitrogen-containing gas, and forming a second electrode layer, so that the first metal layer is disposed between the first electrode layer and the second electrode layer.

According to yet another embodiment of the present invention, a method of forming a variable resistance layer in a nonvolatile memory element includes the steps of forming a first electrode layer on a substrate, depositing a metal nitride layer on the first electrode layer, performing an oxidation process on the metal nitride layer to form a metal oxide-nitride layer, and forming a second electrode layer, so that the metal oxide-nitride layer is disposed between the first electrode layer and the second electrode layer.

According to yet another embodiment of the present invention, a method of forming a first electrode layer on a substrate, depositing a metal oxide layer on the first electrode layer, performing a nitridization process on the metal oxide layer to form a metal oxide-nitride layer, and forming a second electrode layer, so that the metal oxide-nitride nitride layer is disposed between the first electrode layer and the second electrode layer.

BRIEF DESCRIPTION OF THE DRAWINGS

So that the manner in which the above recited features of embodiments of the invention can be understood in detail, a more particular description of embodiments of the invention, briefly summarized above, may be had by reference to the appended drawings. It is to be noted, however, that the appended drawings illustrate only typical embodiments of this invention and are therefore not to be considered limiting of its scope, for the invention may admit to other equally effective embodiments.

For clarity, identical reference numbers have been used, where applicable, to designate identical elements that are common between figures. It is contemplated that features of one embodiment may be incorporated in other embodiments without further recitation.

DETAILED DESCRIPTION

Materials used as the variable resistance layer of a nonvolatile resistive memory element are generally required to have bistable properties and preferably can be operated with low switching voltage and switching current. Embodiments of the invention set forth a resistive random access memory (ReRAM) nonvolatile memory element having a novel variable resistance layer that satisfies these requirements. The novel variable resistance layer can include a metal nitride, a metal oxide-nitride, a two-metal oxide-nitride, or a multilayer stack thereof.

Figure 1:
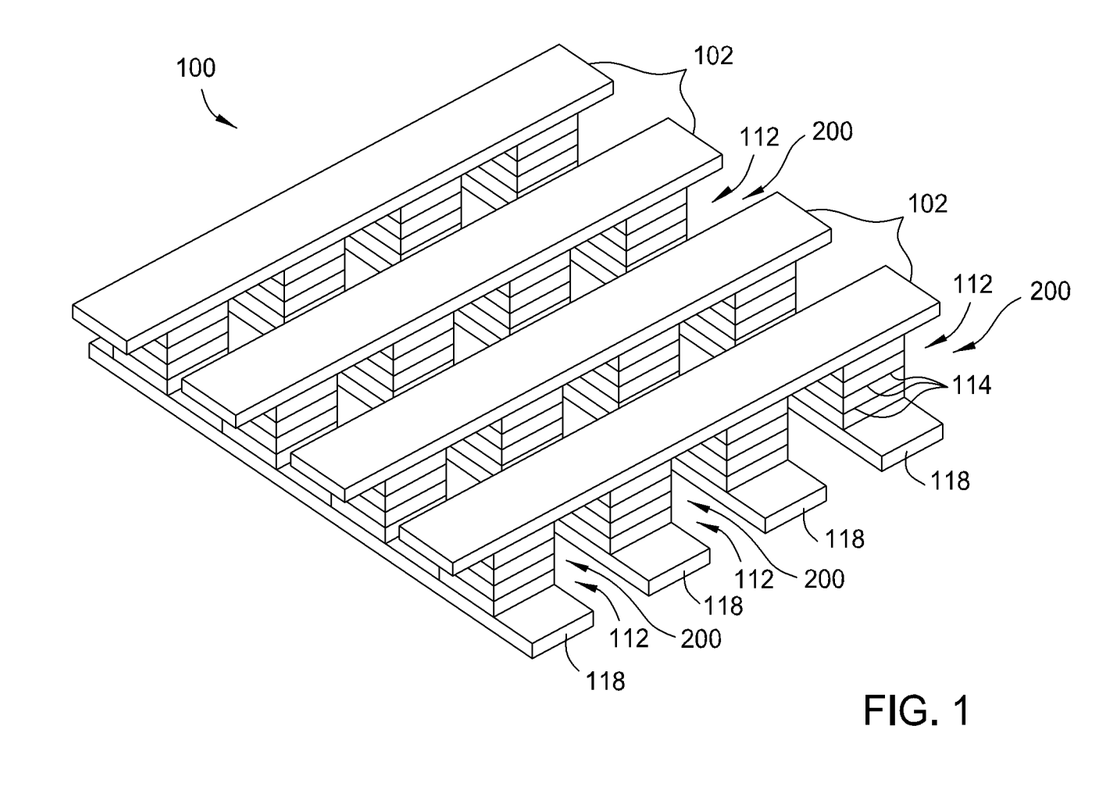
FIG. 1 is a perspective view of a memory array of memory devices, configured according to embodiments of the invention.

FIG. 1 is a perspective view of a memory array 100 of memory devices 200, configured according to embodiments of the invention. Memory array 100 may be part of a larger memory device or other integrated circuit structure, such as a system-on-a-chip type device. Memory array 100 may be formed as part of a high-capacity nonvolatile memory integrated circuit, which can be used in various electronic devices, such as digital cameras, mobile telephones, handheld computers, and music players. For clarity, memory array 100 is illustrated as a single layer memory array structure. However, memory arrays such as memory array 100 can also be stacked in a vertical fashion to make multilayer memory array structures.

Each of memory devices 200 comprises a nonvolatile resistive switching memory device, such as a resistive random access memory (ReRAM) device. Memory device 200 comprises a novel memory element 112 that may be formed from one or more material layers 114. Material layers 114 include a novel variable resistance layer comprising a metal nitride, a metal oxide-nitride, or a combination of each, and is described below in conjunction with FIG. 4. In some embodiments, memory device 200 also includes a current steering device, which is described below in conjunction with FIGS. 2A, 2B.

Read and write circuitry (not shown) is connected to memory devices 200 using electrodes 102 and orthogonally positioned electrodes 118. Electrodes 102 and electrodes 118, which are sometimes referred to as "bit lines" and "word lines," and are used to read and write data into memory elements 112 in memory devices 200. Individual memory devices 200 or groups of memory devices 200 can be addressed using appropriate sets of electrodes 102 and electrodes 118.

Figure 2A:
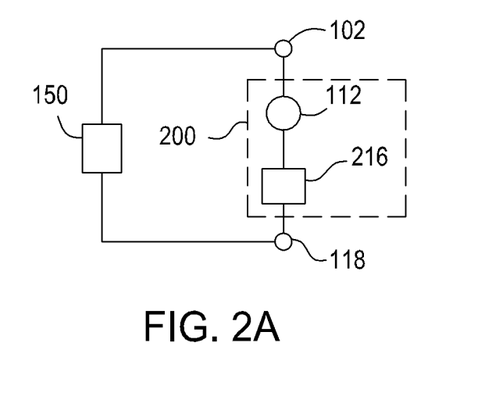
FIG. 2A is a schematic cross-sectional view of a memory device, configured in accordance with an embodiment of the invention.

FIG. 2A is a schematic diagram of a memory device 200 configured in accordance with an embodiment of the invention. Memory device 200 includes memory element 112 and in some embodiments current steering device 216, which are both disposed between electrodes 102 and electrodes 118. In one embodiment, current steering device 216 comprises an intervening electrical component, such as a p-n junction diode, p-i-n diode, transistor, or other similar device that is disposed between electrode 102 and memory element 112, or between electrode 118 and memory element 112. In some embodiments, current steering device 216 may include two or more layers of semiconductor material, such as two or more doped silicon layers, that are configured to allow or inhibit the current flow in different directions through the memory element 112. In addition, read and write circuitry 150 is coupled to memory device 200 via electrodes 102 and electrodes 118 as shown. Read and write circuitry 150 is configured to both sense the resistance state and set the resistance state of memory device 200.

Figure 2B:
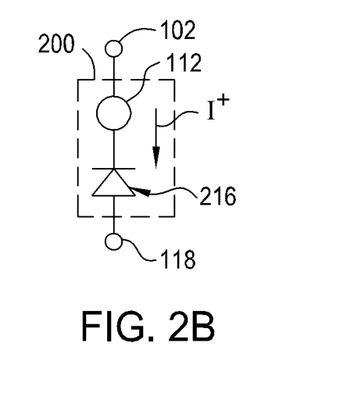
FIG. 2B schematically illustrates a memory device configured to allow current to flow through the memory device in a forward direction, according to embodiments of the invention.

FIG. 2B schematically illustrates memory device 200 configured to allow current to flow through memory device 200 in a forward direction ("I$^+$"), according to embodiments of the invention. However, due to the design of current steering device 216, a reduced current can also flow in the opposing direction through the device by the application of a reverse bias to electrodes 102 and electrodes 118.

Figure 3:
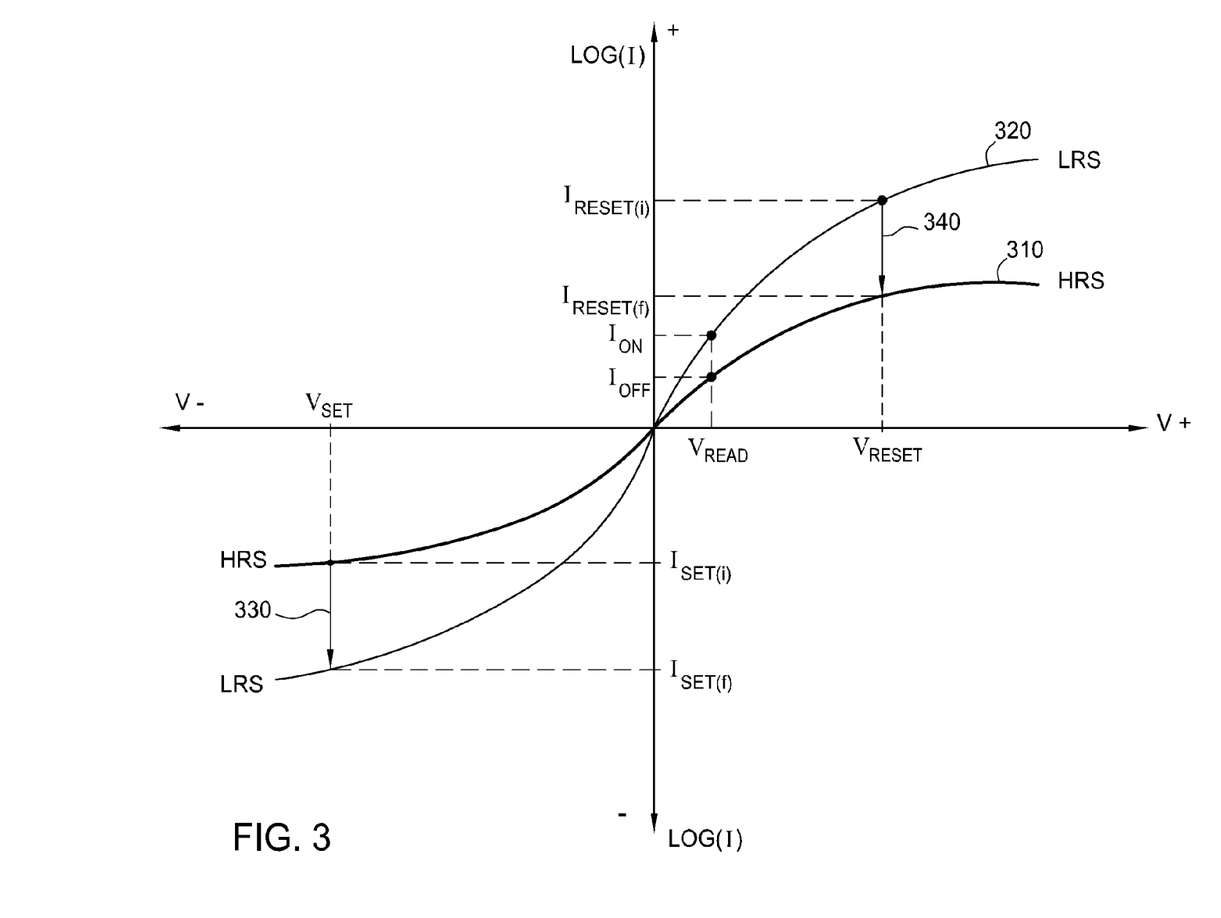
FIG. 3 schematically illustrates exemplary log-log plots of measured current (I) values versus applied voltages (V) of an exemplary embodiment of a memory device having a resistive switching memory element.

FIG. 3 schematically illustrates exemplary log-log plots of measured current (I) values versus applied voltages (V) of an exemplary embodiment of memory device 200 having a resistive switching memory element 112. The resistive switching memory element may be placed in two stable resistance states: a low-resistance-state (LRS), following the I-V curve of a LRS curve 320, or a high-resistance-state (HRS), following the I-V curve of a HRS curve 310.

In general, by sweeping the voltage applied to the electrode layers 102 and 118 between two applied voltages (e.g., between $V_{SET}$ (e.g., −3 volts) and $V_{RESET}$ (e.g., +4 volts)) while memory device 200 is in the low resistance state, the LRS curve 320 is obtained. On the other hand, by sweeping the voltage applied to the electrode layers 102 and 118 between two applied voltages (e.g., between $V_{SET}$ and $V_{RESET}$) while memory device 200 is in the high resistance state, the HRS curve 310 is obtained. Accordingly, resistive switching memory element 112 may either be in a high resistance state (HRS) or a low resistance state (LRS). Resistive switching memory element 112 within memory device 200 can be selectively chosen by read-and-write circuitry 150 to switch between its resistance states. Current steering element 216 is used to regulate (e.g., allow or inhibit, etc.) current such that current will flow through only the desired memory cells when the appropriate set of word-lines and bit-lines and/or electrodes are selected.

During a "set" operation, because of the physical and electrical characteristics of variable resistance layer 206, resistive switching memory element 112 of memory device 200 can switch from the HRS to the LRS (e.g., following the path of an arrow 330), when a "set" switching pulse (e.g., a pulse at $V_{SET}$ voltage level) is applied and delivered through the memory device. By applying the "set" switching pulse to memory device 200, the current flowing through memory device 200 can shift from the initial "set" current level, $I_{SET(i)}$, to the final "set" current level, $I_{SET(f)}$, according to the arrow 330, due to the change in the resistance of the variable resistance layer 206.

In addition, during a "reset" operation, variable resistance layer 206 can function to switch from the LRS to the HRS (e.g., following the path of arrow 340), when a "reset" switching pulse (e.g., a pulse at $V_{RESET}$ voltage level) is delivered to memory device 200. The current flowing through memory device 200 can shift from the initial "reset" current level, $I_{RESET(i)}$, to the final "reset" current level, $I_{RESET(f)}$, due to the change in the resistance of variable resistance layer 206.

During a read operation, the logic state of resistive switching memory element 112 in memory device 200 can be sensed by applying a sensing voltage (i.e., a "read" voltage $V_{READ}$ as shown in FIG. 3, (e.g., applying a sense pulse at about +0.5 volts (V) voltage level)), to an appropriate set of electrodes 102 and 118. Depending on its history, a resistive switching memory element 112 addressed in this way may be either in a high resistance state (HRS) or a low resistance state (LRS). The resistance of resistive switching memory element 112 therefore determines what digital data is being stored by resistive switching memory element 112. If resistive switching memory element 112 is in the low resistance state (LRS), for example, resistive switching memory element 112 may be said to contain a logic one (i.e., a "1" bit). If, on the other hand, resistive switching memory element 112 is in the high resistance state (HRS), resistive switching memory element 112 may be said to contain a logic zero (i.e., a "0" bit).

During a programming operation, the state of a memory element can be changed by application of suitable programming signals to appropriate sets of the electrode layers 102 and 118. In one example, initially, resistive switching memory element 112 may be in a high resistance state (e.g., storing a logic "zero"). The high resistance state (HRS) of resistive switching memory element 112 can be sensed by read and write circuitry 150 (FIG. 2A) using the electrodes 102 and 118. For example, read and write circuitry 150 may apply a read voltage pulse at a $V_{READ}$ voltage level (e.g., +0.5V) to resistive switching memory element 112, and can sense the resulting "off" current level ($I_{OFF}$) that flows through resistive switching memory element 112.

Next, when it is desired to store a logic "one" in memory device 200, resistive switching memory element 112 needs to be placed into its low resistance state (LRS). This may be accomplished by using read and write circuitry 150 to apply a "set" voltage pulse at a $V_{SET}$ (e.g., −2 V to −4 V) voltage level across the electrodes 102 and 118. In one configuration, applying a negative voltage pulse at a $V_{SET}$ voltage level to resistive switching memory element 112 causes resistive switching memory element 112 to switch to its low resistance state (LRS), following the arrow 330. Resistive switching memory element 112 is changed so that, following the removal of the "set" voltage pulse, $V_{SET}$, resistive switching memory element 112 is characterized to be in a low resistance state (LRS). It is believed that the change in the resistance state of resistive switching memory element 112 may be because the reverse biasing of the device cause traps formed in a variable resistance layer in the memory element to be redistributed or filled (i.e., "trap-mediated") during this process. $V_{SET}$ and $V_{RESET}$ are generally referred to as "switching voltages" herein. The low resistance state (LRS) of the resistive switching memory element can be sensed using the read and write circuitry 150. When a read voltage pulse at the $V_{READ}$ level is applied to resistive switching memory element 112, read and write circuitry 150 senses the relatively high "on" current value ($I_{ON}$), indicating that resistive switching memory element 112 is in its low resistance state (LRS).

When it is desired to store a logic "zero" in the memory cell 200, resistive switching memory element 112 can once again be placed in its high resistance state (HRS) by applying a positive "reset" voltage pulse at a $V_{RESET}$ (e.g., +2 V to +5 V) voltage level to the memory device. When read and write circuitry 150 applies $V_{RESET}$ to resistive switching memory element 112, it switches to its high resistance state (HRS), following the arrow 340. When the reset voltage pulse, $V_{RESET}$, is removed from resistive switching memory element 112, resistive switching memory element 112 can once again be tested whether it is in the high resistance state (HRS) by applying a read voltage pulse at the $V_{READ}$ voltage level.

While the discussion of the resistive switching memory element herein primarily provides bipolar switching examples, some embodiments of the resistive switching memory elements may use unipolar switching, where the "set" and "reset" voltage pulses have the same polarity, without deviating from the scope of the invention described herein.

In embodiments of the invention in which a novel variable resistance layer comprises a metal nitride or metal oxide-nitride, it is believed that the defects or traps that provide multiple resistance capability for the variable resistance layer may be nitrogen vacancies. Embodiments of a variable resistance layer, i.e., variable resistance layer 206, are described below in conjunction with FIG. 4. It is believed that the change in the resistive state of the memory element 112 may be "trap-mediated," i.e., due to the redistribution or filling of traps or defects in a variable resistance layer of memory element 112 when memory device 200 is reverse biased. The defects or traps, which are commonly thought to be oxygen vacancies, are formed during the deposition and/or post-processing of the variable resistance layer. For example, oxygen vacancies are likely created by a non-stoichiometric material composition of a host oxide material in the variable resistance layer.

Figure 4:
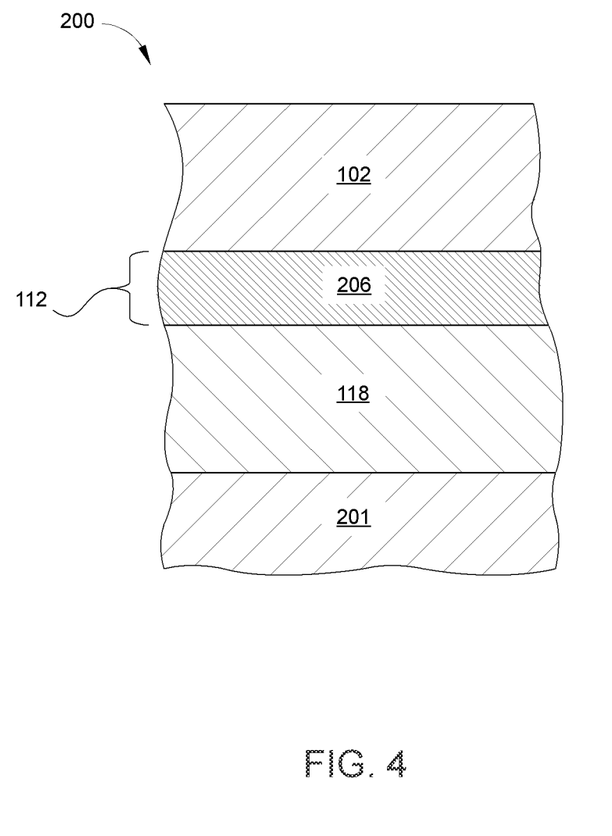
FIG. 4 is a schematic cross-sectional view of a memory device formed from a series of deposited layers, including a novel variable resistance layer, according to embodiments of the invention.

FIG. 4 is a schematic cross-sectional view of memory device 200 formed from a series of deposited layers, including a novel variable resistance layer 206, according to embodiments of the invention. In the embodiment illustrated in FIG. 4, memory device 200 is formed over, or integrated with and disposed over, portions of a surface of a substrate 201 (e.g., a silicon substrate or an SOI substrate). It is noted that relative directional terms used herein with regard to embodiments of the invention are for purposes of description only, and do not limit the scope of the invention. Specifically, directional terms such as "over," "above," "under," and the like are used under the assumption that substrate 201 on which embodiments are formed is a "bottom" element and is therefore "under" elements of the invention formed thereon.

In the embodiment illustrated in FIG. 4, memory device 200 comprises a memory element 112 disposed between electrodes 102, 118. Memory element 112 is a nonvolatile resistive memory element that includes variable resistance layer 206. In other embodiments, memory device 200 further comprises an optional intermediate electrode and optional current steering device 216 disposed between electrode 118 and variable resistance layer 206.

Electrodes 102, 118 are formed from conductive materials that have a desirable work function tailored to the bandgap of the material making up variable resistance layer 206. In some configurations, electrodes 102, 118 are formed from different materials so that electrodes 102, 118 have a work function that differs by a desired value, e.g., 0.1 eV, 0.5 eV, 1.0 eV, etc. For example, in one embodiment, electrode 102 is comprised of TiN, which has a work function of 4.5-4.6 eV, while electrode 118 can be n-type polysilicon, which has a work function of approximately 4.1-4.15 eV. Other electrode materials suitable for use in electrode 102 and/or electrode 118 include p-type polysilicon (4.9-5.3 eV), n-type polysilicon, transition metals, transition metal alloys, transition metal nitrides, transition metal carbides, tungsten (4.5-4.6 eV), tantalum nitride (4.7-4.8 eV), molybdenum oxide (~5.1 eV), molybdenum nitride (4.0-5.0 eV), iridium (4.6-5.3 eV), iridium oxide (~4.2 eV), ruthenium (~4.7 eV), and ruthenium oxide (~5.0 eV). Other potential electrode materials include a titanium/aluminum alloys (4.1-4.3 eV), nickel (~5.0 eV), tungsten nitride (~4.3-5.0 eV), tungsten oxide (5.5-5.7 eV), aluminum (4.2-4.3 eV), copper or silicon-doped aluminum (4.1-4.4 eV), copper (~4.5 eV), hafnium carbide (4.8-4.9 eV), hafnium nitride (4.7-4.8 eV), niobium nitride (~4.95 eV), tantalum carbide (approximately 5.1 eV), tantalum silicon nitride (~4.4 eV), titanium (4.1-4.4 eV), vanadium carbide (~5.15 eV), vanadium nitride (~5.15 eV), and zirconium nitride (~4.6 eV). In some embodiments, electrode 102 is a metal, metal alloy, metal nitride or metal carbide formed from an element selected from a group of materials consisting of titanium (Ti), tungsten (W), tantalum (Ta), cobalt (Co), molybdenum (Mo), nickel (Ni), vanadium (V), hafnium (Hf) aluminum (Al), copper (Cu), platinum (Pt), palladium (Pd), iridium (Ir), ruthenium (Ru), and combinations thereof. In one example, electrode 102 comprises a metal alloy selected from the group of a titanium/aluminum alloy ($Ti_xAl_y$), or a silicon-doped aluminum (AlSi).

Variable resistance layer 206 comprises a dielectric material that can be switched between two or more stable resistive states. In some embodiments, variable resistance layer 206 has a thickness of between about 10 and about 100 Å. Numerous materials have been explored for possible use in variable resistance layers for nonvolatile resistive memory devices, including various oxides and all of the transition metals, i.e., hafnium (Hf), zirconium (Zr), titanium (Ti), tantalum (Ta), and the like. In contrast to such materials, according to embodiments of the invention, variable resistance layer 206 includes a metal nitride, a metal oxide-nitride, a two-metal oxide-nitride, or a multilayer stack thereof, and can have advantageously low "set" voltage $V_{SET}$ and "reset" voltage $V_{RESET}$. For example, a memory device with a variable resistance layer 206 comprised of hafnium nitride ($HfN_x$) has demonstrated better switching performance than a substantially identical memory element in which variable resistance layer 206 is comprised of hafnium oxide ($HfO_x$).

Metal nitrides suitable for use as a variable resistance layer 206 include $HfN_X$, $ZrN_X$, $SiN_X$, $AlN_X$, $TiN_X$, $V_XN_Y$ (e.g., $V_2N$), $NbN_X$ (e.g. $Nb_2N$, $Nb_4N_3$, NbN), $WN_x$ (e.g., $WN_2$), among others. Suitable metal nitrides can be deposited by reactive physical vapor deposition (PVD) and chemical vapor deposition (CVD) processes known in the art. In some embodiments, an atomic layer deposition (ALD) process may be used to deposit such metal nitrides.

Metal oxide-nitrides suitable for use as variable resistance layer 206 include $HfO_xN_y$, $ZrO_xN_y$, $AlO_xN_y$, and $TaO_xN_y$, among others. As used herein, the term "metal oxide-nitride" refers to a material that is a combination of metal oxides and metal nitrides, in contrast with metal oxynitrides, in which the metallic chemical element is bonded with the ON structure. According to embodiments of the invention, such metal oxide-nitride films can be deposited in various ways, including an "interlayer deposition" ALD process; an "intralayer deposition" ALD process; the combination of a metal oxide deposition, a nitridization, and an anneal process; or the combination of a metal nitride deposition, an oxidation, and an anneal process. These different processes are described below in conjunction with FIGS. 6-12.

Two-metal oxide-nitrides suitable for use as variable resistance layer 206 have two metallic or semi-metallic elements and include films such as: $Hf_xSi_yO_zN_{(1-x-y-z)}$, $Zr_xSi_yO_zN_{(1-x-y-z)}$, $Hf_xZr_yO_zN_{(1-x-y-z)}$, and $Hf_xAl_yO_zN_{(1-x-y-z)}$. Two-metal oxide-nitrides may be deposited with a co-sputtering PVD process or by a series of ALD processes similar to that used for the deposition of metal oxide-nitrides. Alternatively, two-metal oxide-nitrides may be deposited via an interlayer deposition ALD process or an intralayer deposition ALD process. Such ALD processes are described below in conjunction with FIGS. 6-12. Suitable metals for such two-metal oxide-nitrides include hafnium (Hf), zirconium (Zr), aluminum (Al), tantalum (Ta), titanium (Ti), vanadium (V), niobium (Nb), and tungsten (W) and suitable semi-metallic elements include silicon (Si).

Figure 5:
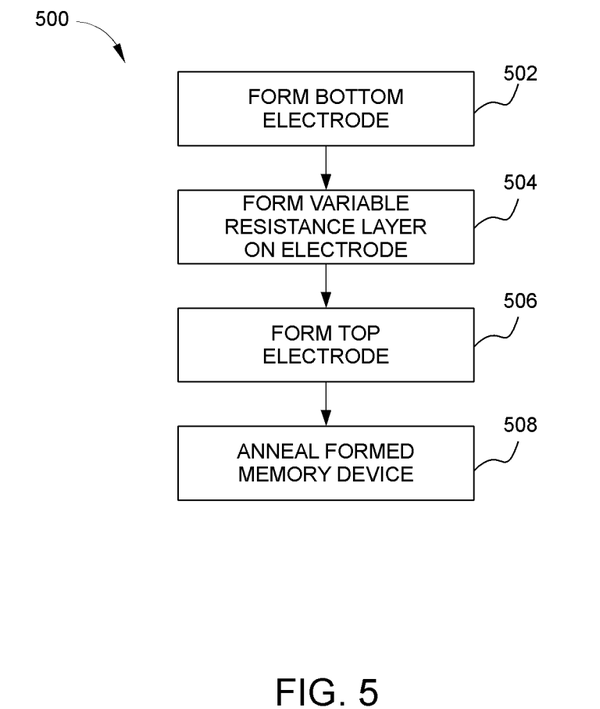
FIG. 5 sets forth a flowchart of method steps in a process sequence for forming a memory device, according to one embodiment of the invention.

FIG. 5 sets forth a flowchart of method steps in a process sequence 500 for forming memory device 200, according to one embodiment of the invention. Although the method steps are described in conjunction with memory device 200 in FIG. 4, persons skilled in the art will understand that formation of other resistive switching memory devices using process sequence 500 is within the scope of the invention.

As shown, method 500 begins at step 502, in which electrode 118 is formed on substrate 201. In one embodiment, electrode 118 is a highly doped polysilicon layer that is formed on substrate 201 using a conventional CVD or ALD type polysilicon deposition technique. In one embodiment, electrode 118 comprises polysilicon, and is between about 50 and about 5000 Å thick.

In step 504, variable resistance layer 206 is formed on electrode 118 using one or more deposition processes. Embodiments of the invention include various methods of depositing variable resistance layer 206, and depend in part on the specific composition of variable resistance layer 206. Exemplary methods of depositing variable resistance layer 206 are described below in conjunction with FIGS. 6-12.

In step 506, electrode 102 is formed above variable resistance layer 206 as shown in FIG. 4 using one or more of the materials suitable for electrode 102 listed above in conjunction with FIG. 4. Electrode 102 may be formed using a deposition process, such as a PVD, CVD, ALD or other similar process. In one embodiment, electrode 102 is between about 500 Å and 1 μm thick.

In step 508, formed memory device 200 is thermally processed, e.g., via an anneal process. Temperature and duration of the anneal process is a function of the configuration of memory device 200 as well as the materials included in memory device 200. For example, in some embodiments, the anneal process takes place at a temperature of greater than about 550° C. In other embodiments, the anneal process takes place at a temperature of greater than about 600° C. In yet other embodiments, the anneal process takes place at a temperature of greater than about 1000° C. Duration of the anneal process can also vary greatly, e.g. varying between about 30 seconds and 20 minutes depending on the configuration of memory device 200. Furthermore, vacuum anneals, oxygen anneals, anneals using gas mixtures, such as a hydrogen/argon mixture, and other anneal processes known in the art fall within the scope of the invention. Similarly, multiple thermal processing steps may be performed on memory device 200 without exceeding the scope of the invention. For example, a thermal process may be performed during or after multiple steps of method 500.

As noted above, variable resistance layer 206 may comprise a metal nitride, a metal oxide-nitride, a two-metal oxide-nitride, or a multilayer stack thereof. Various techniques can be used to deposit metal nitrides, such as PVD, ALD, and CVD processes known in the art. On the other hand, metal oxide-nitrides, two-metal oxide-nitrides, and multilayer stacks of metal oxide-nitrides may be deposited according to various embodiments of the invention, including an "interlayer deposition" process, described in conjunction with FIGS. 6-9; an "intralayer deposition" process, described in conjunction with FIG. 10; the combination of a metal oxide deposition process, a nitridization process, and an optional anneal process, described in conjunction with FIG. 11; or a combination of a metal nitride deposition process, an oxidation process, and an optional anneal process, described in conjunction with FIG. 12.

Figure 6:
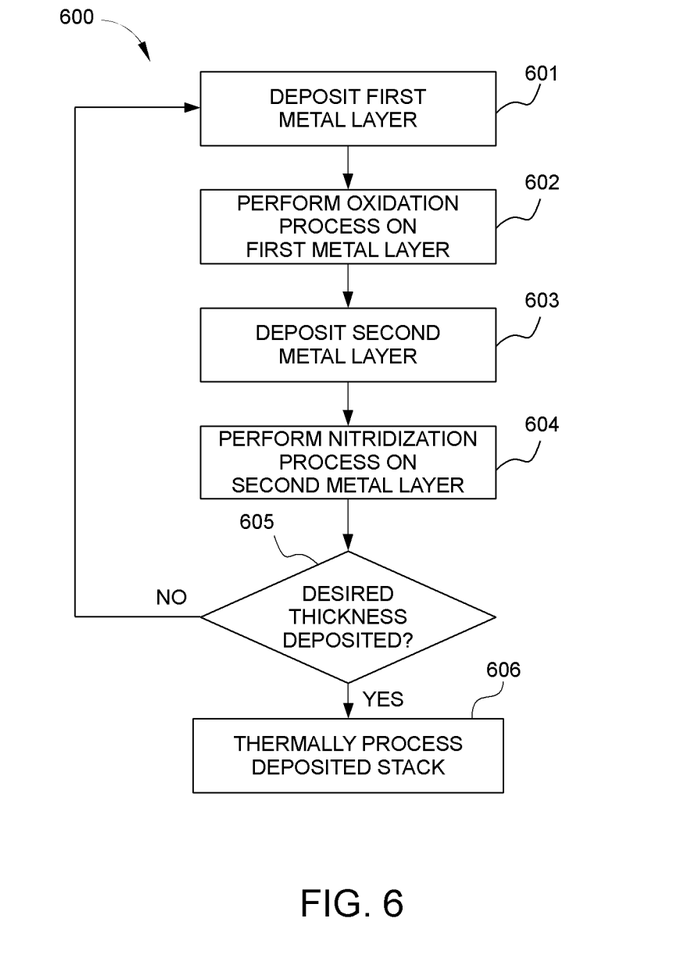
FIG. 6 sets forth a flowchart of method steps in a process sequence for forming a variable resistance layer using an interlayer deposition procedure, according to one embodiment of the invention.

FIG. 6 sets forth a flowchart of method steps in a process sequence 600 for forming variable resistance layer 206 using an "interlayer deposition" procedure, according to one embodiment of the invention. In method 600, a metal oxide-nitride layer is formed by sequentially interleaving different ALD processes in an "interlayer deposition" procedure, in which metal oxide layers are interspersed with metal nitride layers, and then converted into a substantially homogeneous layer by an anneal process. Although the method steps are described in conjunction with memory device 200 in FIG. 4, persons skilled in the art will understand that formation of other variable resistance layers using process sequence 600 is within the scope of the invention.

As shown, method 600 begins at step 601, in which a metal layer is formed on a suitably prepared and activated surface, such as the surface of electrode 118 after being hydroxylated. The metal layer is formed by exposure of the prepared and activated surface of electrode 118 to a suitable precursor. For example, for the deposition of a hafnium (Hf) layer, precursors such as tetrakis(dimethylamido) hafnium (Hf(NMe$_2$)$_4$), tetrakis(ethylmethylamido) hafnium (Hf(NMeEt)$_4$), and/or tetrakis(diethylamido) hafnium (Hf(NEt$_2$)$_4$) may be used. In another example, for the deposition of a zirconium (Zr) layer, tetrakis(dimethylamido) zirconium (Zr(NMe$_2$)$_4$), tetrakis(ethylmethylamido) zirconium (Zr(NMeEt)$_4$), and/or tetrakis(diethylamido) zirconium (Zr(NEt$_2$)$_4$) may be used. Generally, the metal layer formed in step 601 is on the order of one monolayer thick. In some embodiments, an optional purge process is performed at the completion of step 601 to remove residual precursors from the ALD chamber.

In step 602, the metal layer deposited in step 601 undergoes an oxidation process to form a metal oxide (Mo$_x$) layer. For example, the metal layer is exposed to an oxygen source, such as water vapor or ozone (O$_3$). In some embodiments, the oxidation process is carried out for a time duration and at an oxygen concentration level that fully oxidizes the metal layer. In some embodiments, an optional purge process is performed at the completion of step 602 to remove residual oxygen-source gas from the ALD chamber.

In step 603, a second metal layer is deposited on the metal oxide layer formed in step 602, using the process described in step 601. In some embodiments, the second metal layer deposited in step 603 has the same composition as the first metal layer deposited in step 601.

In step 604, the metal layer deposited in step 603 undergoes a nitridization process to form a metal nitride layer (Mn$_x$). For example, the metal layer is exposed to a reactive nitrogen-containing gas, such as ammonia (NH$_3$). When exposed to the metal layer, nitrogen in the reactive nitrogen-containing gas diffuses into the metal layer. In some embodiments, the nitridization process is carried out for a time duration and at a nitrogen concentration level that fully nitiridizes the metal layer. In some embodiments, an optional purge process is performed at the completion of step 604 to remove residual reactive nitrogen-containing gas from the ALD chamber.

In step 605, the determination is made whether or not the desired thickness of variable resistance layer 206 has been reached. Because an ALD process is used to deposit the metal layers in method 600, each metal oxide and metal nitride layer is on the order of a single monolayer in thickness. Consequently, in order to form variable resistance layer 206 with a suitable thickness, (e.g., 10 to 100 Å), multiple cycles of steps 601-604 are generally performed, (e.g., 2 to 20 or more). If the requisite number metal layers have been deposited, method 600 proceeds to step 606. If not, method 600 proceeds back to step 601.

In step 606, the stack of alternating metal oxides and metal nitrides is thermally processed, e.g., by the thermal processing in step 508 of method 500. The duration and temperature of the thermal processing of step 606 depend on the specific metal and thickness of variable resistance layer 206 formed in step 601-605. Upon completion of step 606, the stack of alternating metal oxides and metal nitrides is converted to a substantially homogeneous layer of metal oxide-nitride.

Figure 7A:
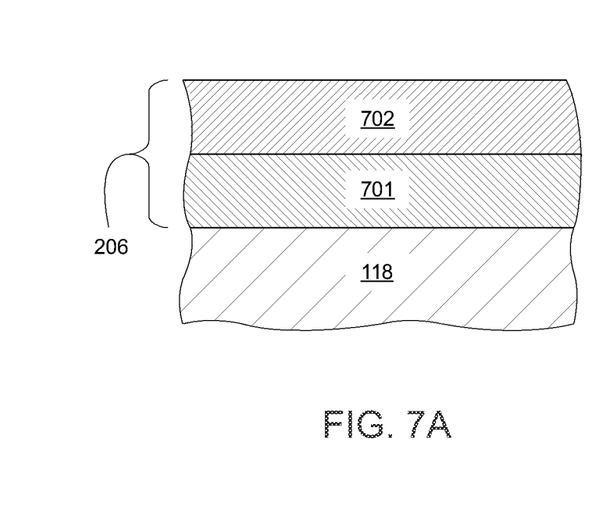
FIG. 7A schematically illustrates a cross-sectional view of a variable resistance layer formed prior to thermal processing, according to an embodiment of the invention.

FIG. 7A schematically illustrates a cross-sectional view of variable resistance layer 206 formed in steps 601-604 of method 600 prior to the thermal processing of step 606, according to an embodiment of the invention. As shown, variable resistance layer 206 includes a metal oxide (MO$_x$) layer 701 and a metal nitride (MN$_x$) layer 702. According to different embodiments of the invention, variable resistance layer 206 includes multiple alternating layers of metal oxide (MO$_x$) layer 701 and metal nitride (MN$_x$) layer 702, where the metal contained therein may be any metal suitable for use as variable resistance layer 206 in memory device 200, including hafnium (Hf), zirconium (Zr), aluminum (Al), tantalum (Ta), titanium (Ti), vanadium (V), niobium (Nb), tungsten (W), and the like. For clarity, variable resistance layer 206 in FIG. 7A only includes a single metal oxide (MO$_x$) layer 701 and a single metal nitride (MN$_x$) layer 702. In practice, the number of alternating metal oxide (MO$_x$) layers 701 and metal nitride (MN$_x$) layers 702 can be on the order of 2 to 20 or more, so that variable resistance layer 206 has the desired thickness for proper operation of memory device 200. Also, in some embodiments, metal nitride (MN$_x$) layer 702 is deposited first, followed by metal oxide (Mo$_x$) layer 701.

Figure 7B:
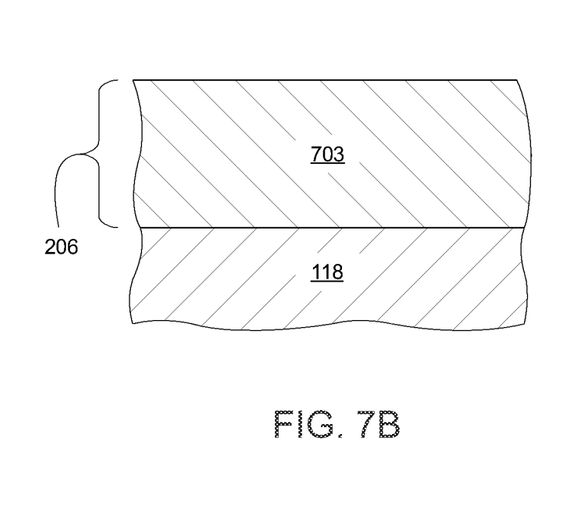
FIG. 7B schematically illustrates a cross-sectional view of a variable resistance layer formed after thermal processing, according to an embodiment of the invention.

FIG. 7B schematically illustrates a cross-sectional view of variable resistance layer 206 formed after the thermal processing of step 606 in method 600, according to an embodiment of the invention. As shown, after such thermal processing, variable resistance layer 206 comprises a substantially homogeneous metal oxide-nitride (MO$_x$N$_y$) layer 703, which is formed when metal oxide layer (MO$_x$) 701 and metal nitride (MN$_x$) layer 702 are thermally annealed. Thus, in such embodiments, variable resistance layer 206 comprises a metal oxide-nitride formed on electrode 118 by depositing alternating layers of metal oxide and metal nitride and then annealing the alternating layers.

In some embodiments, method 600 can be used to form a two-metal oxide-nitride. In such embodiments, a first metal oxide (M1O$_x$) layer is formed on a desired surface in steps 601 and 602, and a second metal nitride (M2O$_x$) layer is formed in steps 603 and 604, where the first metal and the second metal may be any metal suitable for use as variable resistance layer 206 in memory device 200. The first metal oxide (M1O$_x$) layer and the second metal nitride (M2O$_x$) layer are then combined in an anneal process to form a substantially homogeneous layer of a two-metal oxide-nitride material. In some embodiments, one of either the first metal or the second metal is a semi-metallic element, such as silicon, so that after the anneal process in step 606, a metal-silicon oxide-nitride layer is formed (e.g., Hf$_x$Si$_y$O$_z$N$_{(1-x-y-z)}$.

Figure 8A:
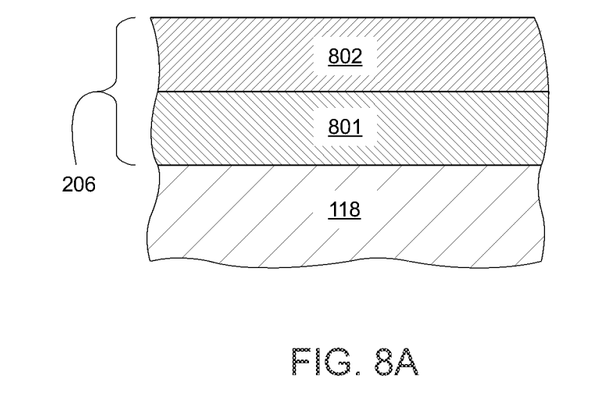
FIG. 8A schematically illustrates a cross-sectional view of another variable resistance layer formed prior to thermal processing, according to an embodiment of the invention.
Figure 8B:
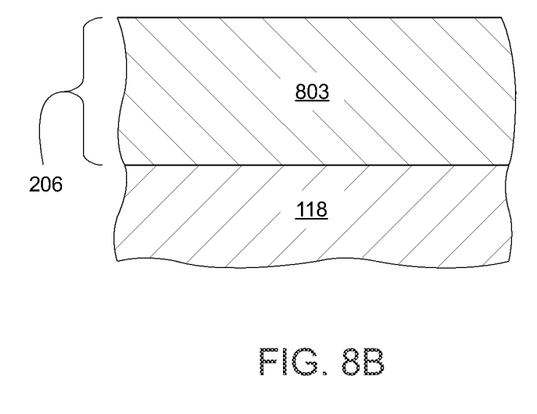
FIG. 8B schematically illustrates a cross-sectional view of another variable resistance layer formed after thermal processing, according to an embodiment of the invention.

FIG. 8A schematically illustrates a cross-sectional view of variable resistance layer 206 formed in steps 601-604 of method 600 prior to the thermal processing of step 606, according to an embodiment of the invention. As shown, variable resistance layer 206 includes a first metal oxide (M1O$_x$) layer 801 and a second metal nitride (M2N$_x$) layer 802. For clarity, variable resistance layer 206 only includes a single first metal oxide (M1O$_x$) layer 801 and a single second metal nitride (M2N$_x$) layer 802, whereas in practice, the number of alternating first metal oxide (M1O$_x$) layers 801 and second metal nitride (M2N$_x$) layers 802 can be on the order of 2 to 20 or more, so that variable resistance layer 206 has the desired thickness for proper operation of memory device 200. Also, in some embodiments, second metal nitride (M2N$_x$) layer 802 is deposited first, followed by first metal oxide (M1O$_x$) layer 801. FIG. 8B schematically illustrates a cross-sectional view of variable resistance layer 206 formed after the thermal processing of step 606 in method 600, according to an embodiment of the invention. As shown, after such thermal processing, variable resistance layer 206 comprises a substantially homogeneous two-metal oxide-nitride (M1$_x$M2$_y$O$_z$N$_{(1-x-y-z)}$) layer 803, which is formed when first metal oxide layer (M1O$_x$) 801 and second metal nitride (M2N$_x$) layer 802 are annealed. In an exemplary embodiment, first metal oxide (M1O$_x$) layer 801 is a hafnium oxide (HfO$_x$) layer, second metal nitride (M2N$_x$) layer 802 is a silicon nitride (SiN) layer, and two-metal oxide-nitride (M1$_x$M2$_y$O$_z$N$_{(1-x-y-z)}$) layer 803 is a substantially homogeneous layer of Hf$_x$Si$_y$O$_z$N$_{(1-x-y-z)}$.

It is noted that the inclusion of silicon in a two-metal oxide-nitride in layer 803 can improve the switching properties of variable resistance layer 206 by increasing the crystalline-limit temperature of variable resistance layer 206. This is because the addition of silicon to variable resistance layer 206 forms an amorphous nitride that is thermally metastable. In the case of Hf$_x$Si$_y$O$_z$N$_{(1-x-y-z)}$) the HfO$_x$ is a metallic bond and SiN is covalently bonded. The combination of two amorphous nitrides, where one has a metallic bond and one has a covalent bond, provides a relatively high crystallized temperature that is higher than the thermal budget for memory device 200. Therefore, in such embodiments, after thermal anneal occurs in the integration flow for memory device 200, variable resistance layer 206 remains amorphous.

In some embodiments, the interlayer deposition procedure of method 600 can be used to form a multilayer stack of materials for variable resistance layer 206. For example, the multilayer stack may include a metal oxide or a metal nitride as a first layer and a metal oxide-nitride as a second layer. In such embodiments, the first layer may be deposited using techniques currently known in the art, such as ALD, PVD, and CVD, while the second layer may be deposited using method 600. In one embodiment, an ALD process is used to deposit a first layer of metal oxide or metal nitride, then, as a continuation of the ALD process in the same chamber, the interlayer deposition procedure of method 600 is performed to form the metal oxide-nitride layer on the first layer. In an alternative embodiment, the interlayer deposition procedure of method 600 is used to form the metal oxide-nitride layer as a first layer in variable resistance layer 206 and a subsequent ALD process is performed in the same ALD chamber to form a metal oxide or a metal nitride as a second layer in variable resistance layer 206. In yet another embodiment, the multilayer stack of materials for variable resistance layer 206 may include a two-metal oxide-nitride as one layer and a metal oxide or metal nitride as a second layer. For example, a two-metal oxide-nitride layer similar to two-metal oxide-nitride (M1$_x$M2$_y$O$_z$N$_{(1-x-y-z)}$) layer 803, as shown in FIG. 8B, may be formed as described above as a first layer of a multilayer stack, and a metal oxide or metal nitride layer similar to metal oxide layer (MO$_x$) 701 or metal nitride (MN$_x$) layer 702, as shown in FIG. 7, may be formed as a second layer of a multilayer stack. Each layer of such multilayer stacks may be formed by a plurality of ALD deposition cycles, (e.g., 2 to 20 or more).

Figure 9A:
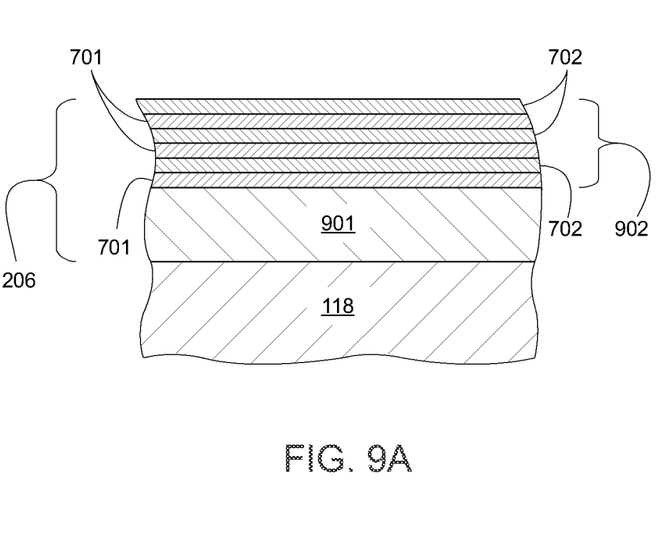
FIG. 9A schematically illustrates a cross-sectional view of a variable resistance layer comprising a multilayer stack having a first layer and a second layer, prior to a thermal processing step, according to an embodiment of the invention.
Figure 9B:
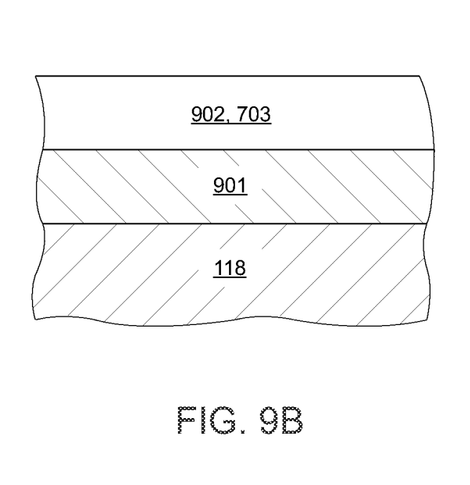
FIG. 9B schematically illustrates a cross-sectional view of a variable resistance layer formed after a thermal processing of step, according to an embodiment of the invention.

FIG. 9A schematically illustrates a cross-sectional view of variable resistance layer 206 comprising a multilayer stack having a first layer 901 and a second layer 902, prior to a thermal processing step, according to an embodiment of the invention. First layer 901 is a metal oxide (MO$_x$) or metal nitride (MNx) layer and second layer 902 is a metal oxide-nitride layer. First layer 901 may be a single layer of metal oxide or metal nitride deposited by various techniques known in the art. As shown, second layer 902 includes a plurality of alternating layers, i.e., metal oxide layer (MO$_x$) 701 and metal nitride (MN$_x$) layer 702, formed as described above in conjunction with FIGS. 6 and 7. FIG. 9B schematically illustrates a cross-sectional view of variable resistance layer 206 formed after a thermal processing of step, such as step 606 in method 600, according to an embodiment of the invention. As shown, after such thermal processing, second layer 902 comprises a substantially homogeneous layer that is substantially similar to metal oxide-nitride (MO$_x$N$_y$) layer 703, which is formed when metal oxide (MO$_x$) layers 701 and metal nitride (MN$_x$) layers 702 are annealed. Thus, in such embodiments, variable resistance layer 206 comprises a multilayer stack of materials, which can have advantageous properties when used as a resistive switching material. For example, in some embodiments, each layer in a multilayer stack can advantageously have different functions. Specifically, one layer or more layers of the multilayer stack can act as the variable resistance layer while other layers of the multilayer stack can assist the variable resistance layer portion of the multilayer stack in performing the switching function. This assistance can be in the form of acting as a current limiter layer or providing a doping source for the variable resistance layer portion of the multilayer stack.

In some embodiments, variable resistance layer 206 is formed by sequentially interleaving different ALD processes in an "intralayer deposition" procedure to deposit a single layer of metal oxide-nitride or other desired nitride-containing material as part of variable resistance layer 206. The sequence of different ALD processes is repeated until the desired thickness of the nitride-containing material is achieved.

Figure 10:
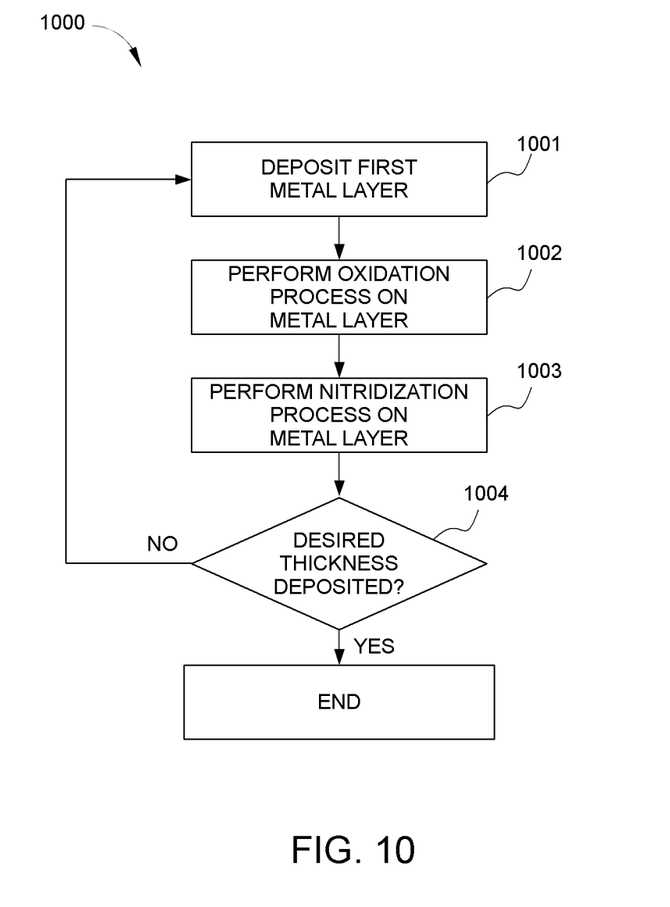
FIG. 10 sets forth a flowchart of method steps in a process sequence for forming a variable resistance layer using an intralayer deposition procedure, according to embodiments of the invention.

FIG. 10 sets forth a flowchart of method steps in a process sequence 1000 for forming variable resistance layer 206 using an intralayer deposition procedure, according to embodiments of the invention. It is noted that in method 1000, a single layer of material is formed via a series of different ALD processes, whereas in the intralayer deposition procedure of method 600, two different material layers are formed that are subsequently annealed to form a substantially uniform material layer. Although the method steps are described in conjunction with memory device 200 in FIG. 4, persons skilled in the art will understand that formation of other variable resistance layers using process sequence 1000 is within the scope of the invention.

As shown, method 1000 begins at step 1001, in which a metal layer is formed on a suitably prepared and activated surface, such as the surface of electrode 118 after being hydroxylated. The ALD metal layer deposition in step 1001 may be substantially similar to that in step 601, described above in method 600, and forms a metal layer formed that is on the order of one monolayer thick.

In step 1002, the metal layer deposited in step 1001 undergoes an oxidation process to form a metal oxide ($Mo_x$) layer. The oxidation process of step 1002 may be substantially similar to that described in step 602 of method 600, except that the oxidation process of step 1002 is not designed to fully oxidize the metal layer. Instead, step 1003 begins before the metal layer can be completely oxidized. In this way, the deposited metal oxide ($Mo_x$) layer can include a combination of metal oxide and metal nitride.

In step 1003, the partially oxidized metal layer is exposed to a reactive nitrogen-containing gas, such as ammonia. It is noted that step 1003 begins only a short time after the initiation of step 1002, so that the metal layer can be nitridized as well as oxidized. Depending on the particular metal layer deposited in step 1001, as well as the particular oxygen source and nitrogen source being used in steps 1002 and 1003, the relative rates of the oxidation and nitridization processes can be controlled by adjusting the concentration of the oxygen source and the nitrogen-containing gas. In this way a metal layer is formed that includes a combination of metal oxide ($MO_x$) and metal nitride ($MN_x$), i.e., a metal oxide-nitride layer. In some embodiments, at the conclusion of step 1003 an optional purge process is performed to remove residual oxygen-source gas and nitrogen-containing gas from the ALD chamber. It is noted that in some embodiments of method 1000, the nitridization process in step 1003 can be initiated before the oxidation process in step 1002.

In step 1004, the determination is made whether or not the desired thickness of variable resistance layer 206 has been reached. Because an ALD process is used to deposit a metal oxide-nitride layer in method 1000, each metal oxide-nitride layer is on the order of a single monolayer in thickness. Consequently, in order to form variable resistance layer 206 with a suitable thickness, (e.g., 10 to about 100 Å), a large number of cycles of steps 1001-1003 are generally performed (e.g., 2 to 20 or more). If the requisite number metal layers have been deposited, method 1000 ends. If not, method 1000 proceeds back to step 1001.

In some embodiments, the intralayer deposition procedure of method 1000 may be used to deposit a two-metal oxide-nitride. In such embodiments, in step 1001, a second metal layer is formed on the first metal layer using a second ALD process. For example, a hafnium layer is deposited using any technically feasible ALD process known in the art, then a silicon layer is deposited on the hafnium layer using any ALD process known in the art. Together, the oxidation process of step 1002 and the nitridization process of step 1003 form a hafnium silicon oxide-nitride ($Hf_xSi_yO_zN_{(1-x-y-z)}$) layer.

In some embodiments, the intralayer deposition procedure of method 1000 can be used to form a multilayer stack of materials for variable resistance layer 206. For example, the multilayer stack may include a metal oxide or a metal nitride as a first layer and a metal oxide-nitride or two-metal oxide-nitride as a second layer. In such embodiments, the first layer may be deposited using techniques currently known in the art, such as ALD, PVD, and CVD, while the second layer may be deposited using method 1000. For example, in one embodiment, an ALD process is used to deposit a first layer of metal oxide or metal nitride, then, as a continuation of the ALD process in the same chamber, the intralayer deposition procedure of method 1000 is performed to form the metal oxide-nitride layer or two-metal oxide-nitride on the first layer. Each layer in the multilayer stack may be formed by a plurality of ALD deposition cycles (e.g., 2 to 20 or more).

In an alternative embodiment, the intralayer deposition procedure of method 1000 is performed to form the metal oxide-nitride layer as a first layer in variable resistance layer 206 and a subsequent ALD process is performed in the same ALD chamber to form a metal oxide or a metal nitride as a second layer in variable resistance layer 206. In yet another embodiment, the multilayer stack of materials for variable resistance layer 206 may include a two-metal oxide-nitride as one layer and a metal oxide or metal nitride as a second layer, where the two-metal oxide-nitride layer is formed using method 1000 and the metal oxide or metal nitride layer is formed using a standard ALD or other known deposition process.

In some embodiments, variable resistance layer 206 is formed by the combination of a metal nitride deposition process, an oxidation process, and an optional anneal process. One such embodiment is described below in conjunction with FIG. 11.

Figure 11:
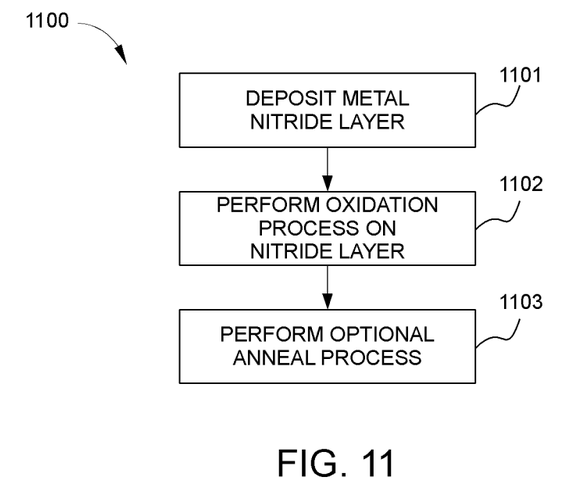
FIG. 11 sets forth a flowchart of method steps in a process sequence for forming a variable resistance layer, according to an embodiment of the invention.

FIG. 11 sets forth a flowchart of method steps in a process sequence 1100 for forming variable resistance layer 206, according to an embodiment of the invention. Although the method steps are described in conjunction with memory device 200 in FIG. 4, persons skilled in the art will understand that formation of other variable resistance layers using process sequence 1100 is within the scope of the invention.

As shown, method 1100 begins at step 1101, in which a metal nitride layer is deposited on a desired surface, such as the surface of electrode 118 in FIG. 4. The metal nitride layer may comprise any metal nitride suitable for use in variable resistance layer 206, including HfN, ZrN, SiN, AlN, $TiN_x$, $V_xN_yNbN_x$, and $WN_x$, among others. Deposition of the metal nitride layer may be accomplished using any suitable deposition method known in the art, including reactive PVD, CVD, and ALD. In some embodiments, the metal nitride layer is deposited as a single layer using PVD or CVD processes, and in other embodiments, the metal layer is deposited using multiple cycles of an ALD metal layer deposition process substantially similar to that described in step 601 of method 600.

In step 1102, the metal nitride layer formed in step 1102 undergoes an oxidation process to form a metal oxide-nitride. Suitable oxidation processes include thermal oxidation in an oxide furnace, rapid thermal oxidation (RTO), and oxygen plasma treatment. Process parameters of the oxidation process of step 1103 may be selected based on the composition and thickness of the metal layer deposited in step 1101.

In an optional step 1103, a thermal anneal process is used to form a substantially homogeneous metal oxide-nitride layer. Temperature and duration of the anneal process is a function of the materials and thickness of variable resistance layer 206. In some embodiments, the thermal anneal process takes place immediately after step 1102. In other embodiments, the thermal anneal process in step 1103 takes place later in the fabrication of memory device 200, such as during the thermal processing described in step 508 of method 500.

In some embodiments, variable resistance layer 206 is formed by the combination of a metal oxide deposition process, a nitridization process, and an optional anneal process. One such embodiment is described below in conjunction with FIG. 12.

Figure 12:
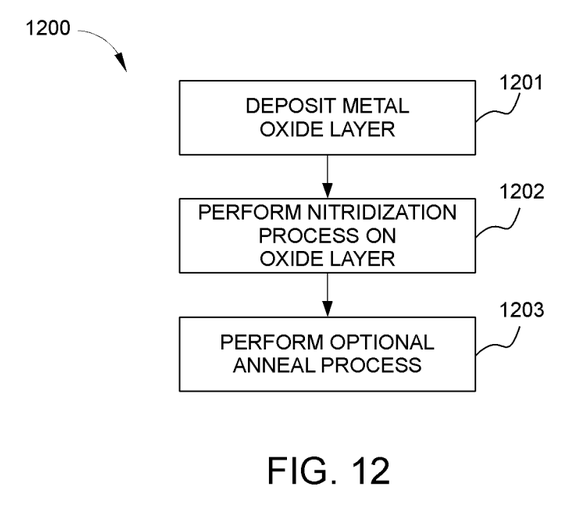
FIG. 12 sets forth a flowchart of method steps in a process sequence for forming a variable resistance layer, according to an embodiment of the invention.

FIG. 12 sets forth a flowchart of method steps in a process sequence 1200 for forming variable resistance layer 206, according to an embodiment of the invention. Although the method steps are described in conjunction with memory device 200 in FIG. 4, persons skilled in the art will understand that formation of other variable resistance layers using process sequence 1200 is within the scope of the invention.

As shown, method 1200 begins at step 1201, in which a metal oxide layer is deposited on a desired surface, such as the surface of electrode 118 in FIG. 4. The metal layer may comprise any metal oxide suitable for use in variable resistance layer 206, including HfO, ZrO, SiO, and AlO. Deposition of the metal oxide layer may be accomplished using any suitable deposition method known in the art, including PVD, CVD, and ALD processes.

In step 1202, the metal oxide layer deposited in step 1201 undergoes a nitridization process to form a metal oxide-nitride. Suitable nitridization processes include decoupled plasma nitridation (DPN) and rapid thermal nitridization (RTN). Process parameters of the nitridization process of step 1202 may be selected based on the composition and thickness of the metal oxide layer deposited in step 1201.

In step 1203, an optional thermal anneal process is used to form a substantially homogeneous metal oxide-nitride layer. Temperature and duration of the anneal process is a function of the materials and thickness of variable resistance layer 206. In some embodiments, the thermal anneal process takes place immediately after step 1202. In other embodiments, the thermal anneal process in step 1203 takes place later in the fabrication of memory device 200, such as during the thermal processing described in step 508 of method 500.

While embodiments of the invention are described herein in terms of resistive switching memory elements that are used to form memory arrays, embodiments of the present invention can be applied to other resistive memory devices without deviating from the basic scope of the invention described herein.

In sum, embodiments of the invention provide a nonvolatile resistive memory element with a novel variable resistance layer comprising a metal nitride, a metal oxide-nitride, a two-metal oxide-nitride, or combinations thereof. One advantage of the present invention is that the use of metal nitrides and/or metal oxide-nitrides as a variable resistance layer can provide low programming and erase voltage and current. Another advantage is that the present invention provides a large number of additional materials that can be used as a variable resistance layer, each additional material having its own physical characteristics, e.g., work function, crystalline limit temperature, resistivity, and the like. Consequently, materials for variable resistance layers can be more readily selected that are suitable for integration into a specific device. In addition, desired film characteristics of a variable resistance layer can be tuned as desired by varying process parameters during the deposition of the variable resistance layer and/or by varying the composition of the switching layer, (e.g., by using a multi-metal film stack, by using a multilayer film stack, or by changing the order of layers disposed in such a stack).

While the foregoing is directed to embodiments of the present invention, other and further embodiments of the invention may be devised without departing from the basic scope thereof, and the scope thereof is determined by the claims that follow.

We claim:

1. A method of forming a nonvolatile memory element, the method comprising:
    forming a first layer, wherein the first layer is operable as an electrode;
    depositing a second layer comprising a first metal layer above the first layer using an atomic layer deposition (ALD) process;
    oxidizing the first metal layer by heating the first metal layer while exposing the first metal layer to an oxygen-containing gas;
    depositing a third layer comprising a second metal layer above the oxidized first metal layer using an ALD process;
    diffusing nitrogen into the second metal layer by exposing the second metal layer to a nitrogen-containing gas; and
    forming a fourth layer operable as an electrode, so that the second layer and the third layer are disposed between the first layer and the fourth layer;
    wherein the diffusing of nitrogen into the second metal layer comprises fully nitridizing the second metal layer.

2. The method of claim 1, wherein the oxidizing of the first metal layer comprises fully oxidizing the first metal layer.

3. The method of claim 1, further comprising performing a thermal anneal process to form a substantially homogeneous material from the oxidized first metal layer and the nitridized second metal layer.

4. The method of claim 1, wherein the first metal layer and the second metal layer comprise different metallic chemical elements.

5. The method of claim 4, wherein one of the second layer and the third layer comprises silicon.

6. The method of claim 4, wherein the second layer and the third layer each comprise at least one of the chemical elements selected from the group of elements consisting of hafnium (Hf), zirconium (Zr), aluminum (Al), tantalum (Ta) titanium (Ti), vanadium (V), niobium (Nb), and tungsten (W).

* * * * *